(12) United States Patent
Voo

(10) Patent No.: US 6,388,506 B1
(45) Date of Patent: May 14, 2002

(54) REGULATOR WITH LEAKAGE COMPENSATION

(75) Inventor: Thart F. Voo, Singapore (SG)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 09/738,715

(22) Filed: Dec. 15, 2000

(51) Int. Cl.$^7$ ................................................. G05F 1/10
(52) U.S. Cl. ...................................... 327/536; 327/537
(58) Field of Search ............................... 327/534, 536, 327/537, 390

(56) References Cited

U.S. PATENT DOCUMENTS

| | | | | |
|---|---|---|---|---|
| 4,961,007 A | * | 10/1990 | Kumanoya et al. | .......... 327/536 |
| 5,072,134 A | * | 12/1991 | Min | ............................. 327/536 |
| 5,426,334 A | * | 6/1995 | Skovmand | .................... 327/536 |
| 5,561,385 A | * | 10/1996 | Choi | ........................... 327/536 |
| 6,031,411 A | * | 2/2000 | Tsay et al. | ................... 327/536 |
| 6,052,022 A | * | 4/2000 | Lee | .............................. 327/536 |
| 6,107,864 A | | 8/2000 | Fukushima et al. | |

* cited by examiner

Primary Examiner—Terry D. Cunningham
(74) Attorney, Agent, or Firm—Eric B. Janofsky

(57) ABSTRACT

The present invention provides a circuit and method for generating a regulated voltage from a voltage source. The regulator circuit includes at least two boost circuits. A first boost circuit generates a first pump voltage. The first boost circuit includes a charge pump for generating the first pump voltage from a first voltage source. The charge pump includes a charge pump switch having a leakage current. A second boost circuit generates a second pump voltage. The second boost circuit includes a charge pump for generating the second pump voltage from a second voltage source. A compensation circuit coupled between the first boost circuit and the second boost circuit supplies a compensation current to the first boost circuit to compensate for energy losses caused by the first boost circuit leakage current. An amplifier includes a reference input coupled to a reference voltage, and a sense input coupled to a sense signal representative of the first pump voltage. The amplifier is operable in response to a difference between the reference voltage and the sense signal, to control the first boost circuit output.

25 Claims, 4 Drawing Sheets

REGULATOR WITH LEAKAGE COMPENSATION

BACKGROUND OF THE INVENTION

1. Field of the Invention

The present invention relates generally to charge pump circuits, and in particular to charge pump circuits that provide a regulated output voltage.

2. Discussion of the Related Art

A charge pump circuit is generally used for boosting a power supply voltage to a higher voltage level to be used for powering ancillary circuits. Closed loop control is sometimes used with charge pumps to provide a regulated output voltage. However, charge pumps that include closed loop control typically have extremely slow response times due to the relatively small amount of energy that can be transferred during each clock cycle. Exacerbating the slow response times is the effect of inherent leakage currents that occur within the charge pump. When diodes within the charge pump are back biased, a small but significant leakage current flows backwards through the diode. Leakage currents transfer charge out of the output storage devices back to the voltage supply, causing the charge pump output voltage to decrease until the next cycle begins. The loading effect of leakage currents on the charge pump output voltage causes an undesirable increase in the ripple amplitude of the output voltage. Compensating for the effect of leakage currents is problematic, since the magnitude of leakage currents is dependent on several factors including the semiconductor manufacturing process, die defects, and temperature.

SUMMARY OF THE INVENTION

The present invention provides a circuit and method for generating a regulated voltage from a first voltage of a first voltage source. The regulator circuit includes at least two boost circuits. A first boost circuit generates a first pump voltage. The first boost circuit includes a charge pump for generating the first pump voltage from a first voltage source. The charge pump includes a charge pump switch having a leakage current. A second boost circuit generates a second pump voltage. The second boost circuit includes a charge pump for generating the second pump voltage from a second voltage source. A compensation circuit coupled between the first boost circuit and the second boost circuit supplies a compensation current to the first boost circuit to compensate for energy losses caused by the first boost circuit leakage current. An amplifier includes a reference input coupled to a reference voltage, and a sense input coupled to a sense signal representative of the first pump voltage. The amplifier is operable in response to a difference between the reference voltage and the sense signal, to control the first boost circuit output.

For a more complete understanding of the invention, its objects and advantages, reference may be had to the following specification and to the accompanying drawings.

DETAILED DESCRIPTION OF THE PREFERRED EMBODIMENT

Figure 1:
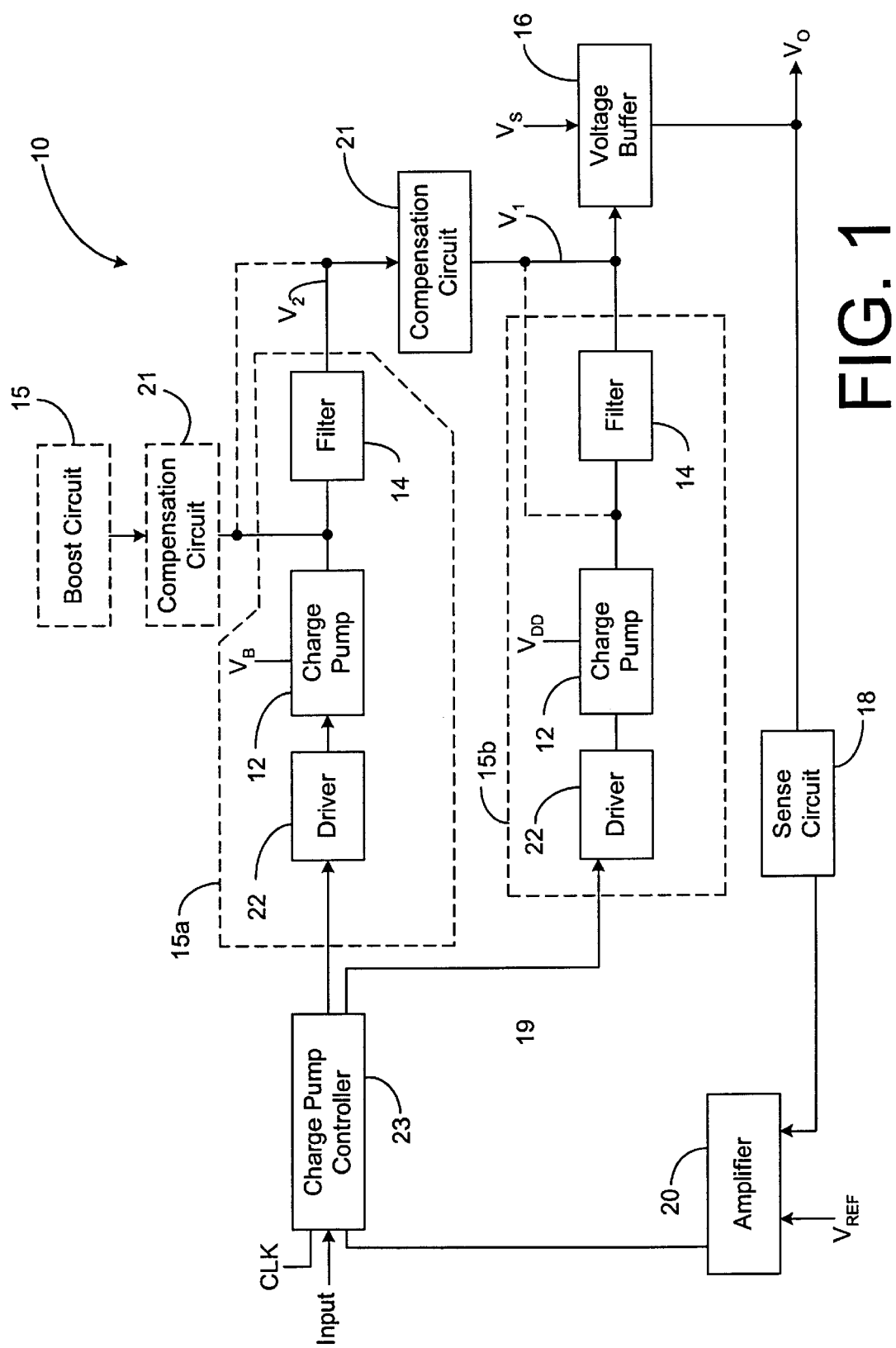
FIG. 1 illustrates a block diagram of a charge pump regulator circuit in accordance with the teachings of the invention.

Referring to FIG. 1, a charge pump regulator circuit 10 constructed in accordance with the principles of the present invention is illustrated. The regulator circuit 10 converts power from a voltage source to a regulated output having low voltage ripple. The present invention is particularly suitable when incorporated into a semiconductor device for providing power to on-chip circuitry such as an output driver stage. While the present invention is shown and described as being incorporated into a semiconductor device, it will be appreciated that the circuit and method may be embodied in a variety of devices including a combination of discrete devices, an application specific integrated circuit, and a field programmable array. The regulator circuit 10 includes two or more boost circuits 15 having boosted output voltages that are coupled together through corresponding compensation circuits 21 to reduce the ripple amplitude of the regulator output voltage. Each of the boost circuits 15 generates an unregulated output voltage that is boosted in amplitude from a corresponding source voltage. A compensation circuit 21 coupled between a pair of boost circuits permits a controlled quantity of current to be injected from one boost circuit into a second boost circuit. The injected current compensates for energy loss in the second boost circuit that is caused by leakage currents in the second boost circuit. The boost circuits 15 are preferably arranged in a hierarchical configuration, wherein one boost circuit couples compensation current into a second boost circuit, a third boost circuit couples compensation current into the first boost circuit, and so on for the remainder of the boost circuits 15. Preferably, the output voltage ripple of the boost circuits 15 is out-of-phase so that ripple cancellation occurs when current is injected from one boost circuit into another boost circuit. It will be appreciated that the division and sharing of functions between the boost circuits may be accomplished in several ways and should therefore not be limited to the described embodiment.

The compensation circuit 21 is preferably coupled from the output of the first boost circuit filter, $V_2$, to the output of the second boost circuit, $V_1$. However, the scope of the invention includes coupling the compensation circuit 21 from the charge pump 12 in the first boost circuit 15a, and to the charge pump 12 in the second boost circuit 15b.

The configuration of the compensation circuit 21 is selected so that the magnitude of the compensation current cancels the leakage current in the second boost circuit. The compensation circuit 21 in the presently preferred embodiment is selected to be a semiconductor device having a leakage current characteristic that approximately matches the leakage current characteristic of the leaking device within the boost circuit that is receiving compensation current from the compensation circuit. The scope of the invention also includes using multiple devices in parallel or series to approximate the leakage current characteristic of the leaking device. In addition, using devices that cumulatively only approximate the leakage current characteristic in one aspect, such as reverse voltage or temperature, is within the scope of the invention.

The presently preferred embodiment of the invention includes a first boost circuit 15b and a second boost circuit 15a. Each of the boost circuits 15 includes a driver 22 for generating a pulsed drive signal to drive a corresponding charge pump circuit 12. The drivers 22 in the presently preferred embodiment are AND gates. However, any suitable device for driving the input of a charge pump circuit is within the scope of the invention, such as devices having push-pull and totem-pole outputs.

The charge pump circuit 12 boosts power from a corresponding pump voltage source up to an unregulated output voltage ranging in value up to twice the amplitude of the pump voltage source. The operation of the charge pump circuit 12 is controlled by the drive signal which is coupled to a drive input 30. The drive signal is typically a pulsating waveform that alternately causes energy to be cycled into a series capacitor, and then out of the series capacitor into a storage capacitor. The output voltage of conventional charge pump circuits varies with the duty cycle and frequency of the drive input, the voltage level of the pump voltage source, the voltage level of the driver output, capacitor values, and load. The scope of the invention encompasses using any charge pump circuit within the described system and method. In addition, the invention encompasses using different charge pump circuits 12 with each of the two or more boost circuits 15. Two such conventional charge pump circuits are illustrated in FIGS. 2A and 2B.

Figure 2A:
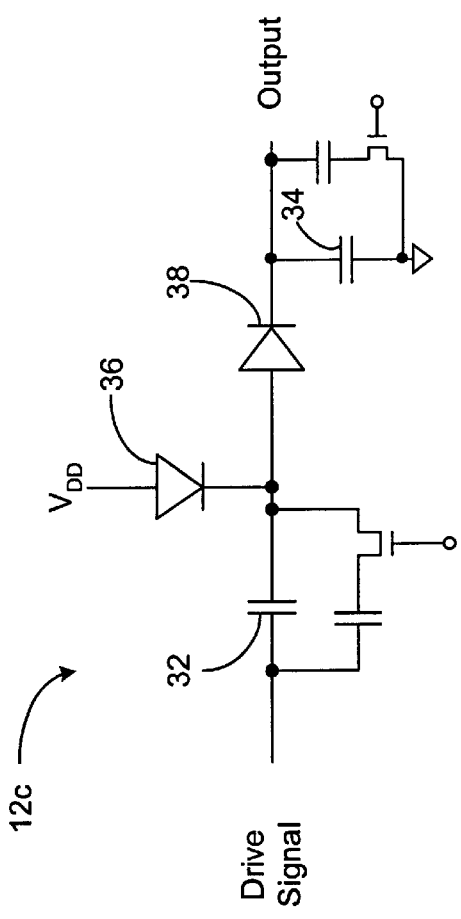
FIG. 2A illustrates a prior art charge pump.

Referring to FIG. 2A, a single stage charge pump circuit 12c is illustrated. The charge pump circuit 12c includes a series capacitor 32, storage capacitor 34, and coupling diodes 36 and 38. In operation, when the drive signal is in the low state, energy from $V_{DD}$ is stored in the series capacitor 32 charging the capacitor 32 up to $V_{DD}$. Then, when the drive signal transitions to the high state, the summation of the energy stored in the series capacitor 32 and energy provided by the drive signal is transferred through the coupling diode 38 charging up the storage capacitor 34. The peak voltage level stored in the storage capacitor 34 is approximately the voltage amplitude of the drive signal plus the voltage of the series capacitor 32. The scope of the invention also includes charge pump circuits that employ mode control circuitry for controlling the charge rate of the charge pump. Mode control circuitry typically consists of a transistor-capacitor combination that is coupled either across or in series with either the series capacitor 32 or the storage capacitor 34. The combination is switched into or out of the circuit to vary the charging rate of the circuit.

Figure 2B:
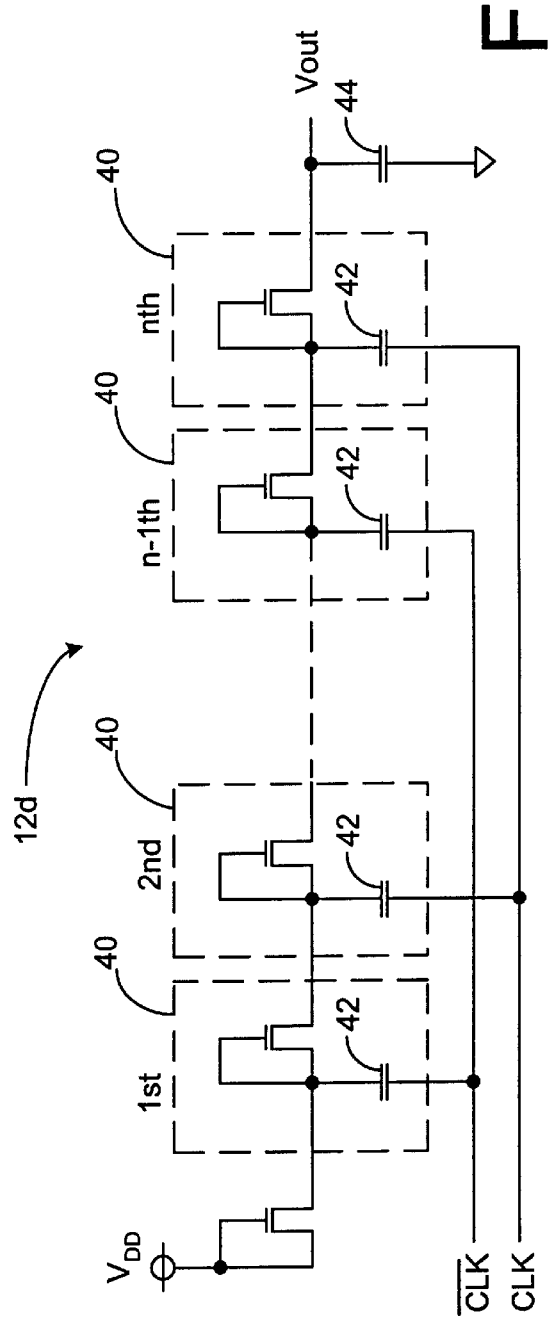
FIG. 2B illustrates another prior art charge pump.

Referring to FIG. 2B, a multistage charge pump circuit 12d is illustrated. The charge pump circuit 12b uses two clock signals to permit multiple boost stages 40 to be series connected. A series capacitor 42 is included in each of the boost stages. A single storage capacitor 44 is coupled to the output of the charge pump circuit 12d.

Again referring to FIG. 1, high frequency components in the pump voltage are attenuated by a filter 14. Preferably, the filter 14 is a low pass filter comprised of a resistor and capacitor. However, the scope of the invention also includes using other low pass filters such as an inductor capacitor filter, as well as not including the filter 14. In addition, although a discrete capacitor is used, it is within the scope of the invention to use the parasitic capacitance of the voltage buffer 16.

The compensated voltage is used to drive a voltage buffer 16 that converts power from another voltage source, $V_S$, to an output voltage, $V_O$, that is proportional to the voltage level of the compensated voltage. In the presently preferred embodiment, the voltage buffer 16 is an NMOS transistor configured as a voltage follower. The scope of the invention additionally includes using other well known voltage buffer circuits such as bipolar transistors configured as voltage followers.

A sense circuit 18 couples a voltage corresponding to the output voltage to the input of an amplifier 20. The sense circuit 18 in the preferred embodiment is a direct connection to the output of the voltage buffer 16. However, as those skilled in the art will readily recognize, the scope invention encompasses other sense circuits such as resistor divider networks. The amplifier 20 compares the sense voltage to a reference voltage that is coupled to another input of the amplifier 20. An error signal is generated by the amplifier 20 based upon the comparison of the sense voltage and reference voltage. The output of the amplifier 20 is coupled to a charge pump controller 23.

The charge pump controller 23 generates controlled clock signals for driving the boosted circuits 15 based upon the error signal and a clock input. Preferably, the controlled clock signals for adjacent boost circuits are out-of-phase. For example, when the clock signal for the first boost circuit 15b is enabled, the clock signal for the second boost circuit 15a is disabled. Specifically, in a three boost circuit configuration the enable signals for the primary boost circuit and a first boost circuit that supplies compensation to the primary boost circuit are preferably generated to be out-of-phase. Likewise, the clock signal for a boost circuit that supplies compensation current to the first boost circuit is generated out-of-phase with the clock signal to the first boost circuit. The scope of the invention includes driving the boost circuits 15 with a common clock signal. In the presently preferred embodiment, the charge pump controller 23 is comprised of discrete logic circuits. However, the scope of the invention also encompasses combining the functions of charge pump controller 23 and drivers 22 into a single module for generating the drive signals to the charge pump circuits 12.

Figure 3:
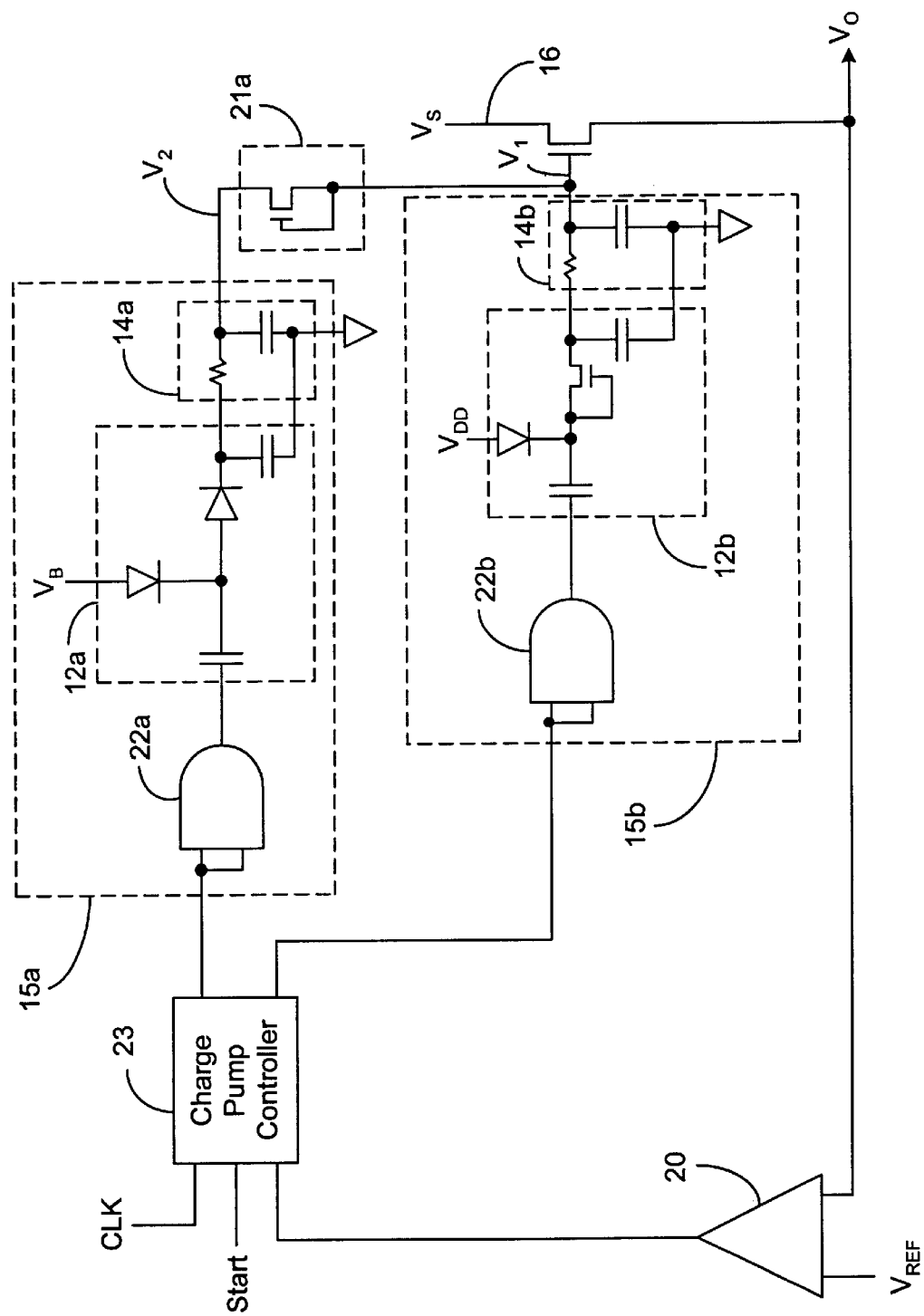
FIG. 3 illustrates a block diagram of a presently preferred embodiment of a voltage regulating circuit in accordance with the teachings of the invention.

Referring to FIG. 3, a presently preferred embodiment of a charge pump regulator circuit 10 constructed in accordance with the principles of the present invention is illustrated. The charge pump regulator circuit includes a first boost circuit 15b and a second boost circuit 15a. Both of the boost circuits 15a and 15b include corresponding drivers 22a and 22b, charge pump circuits 12a and 12b, and filters 14a and 14b. Although in the presently preferred embodiment, the devices within the modules of the boost circuits are similar, it is within the scope of the invention to employ different devices within the modules such using a single charge pump circuit having mode control in the first boost circuit 15b and using a multiple stage charge pump circuit in the second boost circuit 15a.

A compensation circuit 21a couples a compensation current from the output of the second boost circuit 15a to the output of the first boost circuit 15b. The ripple voltage of the second boost circuit 15a is out-of-phase with the ripple voltage of the first boost circuit 15b so that ripple cancellation occurs when current from the second boost circuit 15a is injected into the first boost circuit 15b. In the presently preferred embodiment, the compensation circuit 21a is an NMOS FET that is configured as a back-biased diode. The scope of the invention encompasses using other process and devices such as discrete diodes, current regulator diodes, and bipolar transistors and CMOS FETs configured as back-biased diodes. In addition, the scope of the invention includes using multiple back-biased devices in series or parallel. The compensation circuit 21a of the present embodiment is selected to compensate for current that leaks through an NMOS FET in the first boost circuit charge pump 12b that is configured as a back-biased diode. The output voltage, $V_2$, of the second boost circuit 15a is controlled to be preferably equal to or greater than the nominal output voltage, $V_1$, of the first boost circuit 15b. In the preferred embodiment, the reverse voltage across the compensation circuit 21a is approximately equal to the reverse voltage applied to the diode configured NMOS FET in the first boost circuit charge pump 12b. The scope of the invention also includes selecting the die size of the compensation circuit based on the ratio of reverse voltages applied to the compensation circuit and the diode configured NMOS FET in the first boost circuit charge pump 12b.

Figure 4:
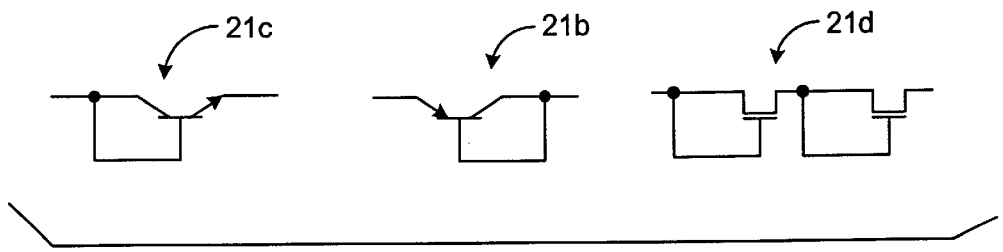
FIG. 4 illustrates several embodiments of a compensation circuit in accordance with the teachings of the invention.

Referring to FIG. 4, several embodiments of the compensation circuit 21 are illustrated. Compensation circuits 21b and 21c show PNP and NPN transistors configured as back-biased diodes. Compensation circuit 21d shows two series connected NMOS FETS configured as back-biased diodes.

Figure 5:
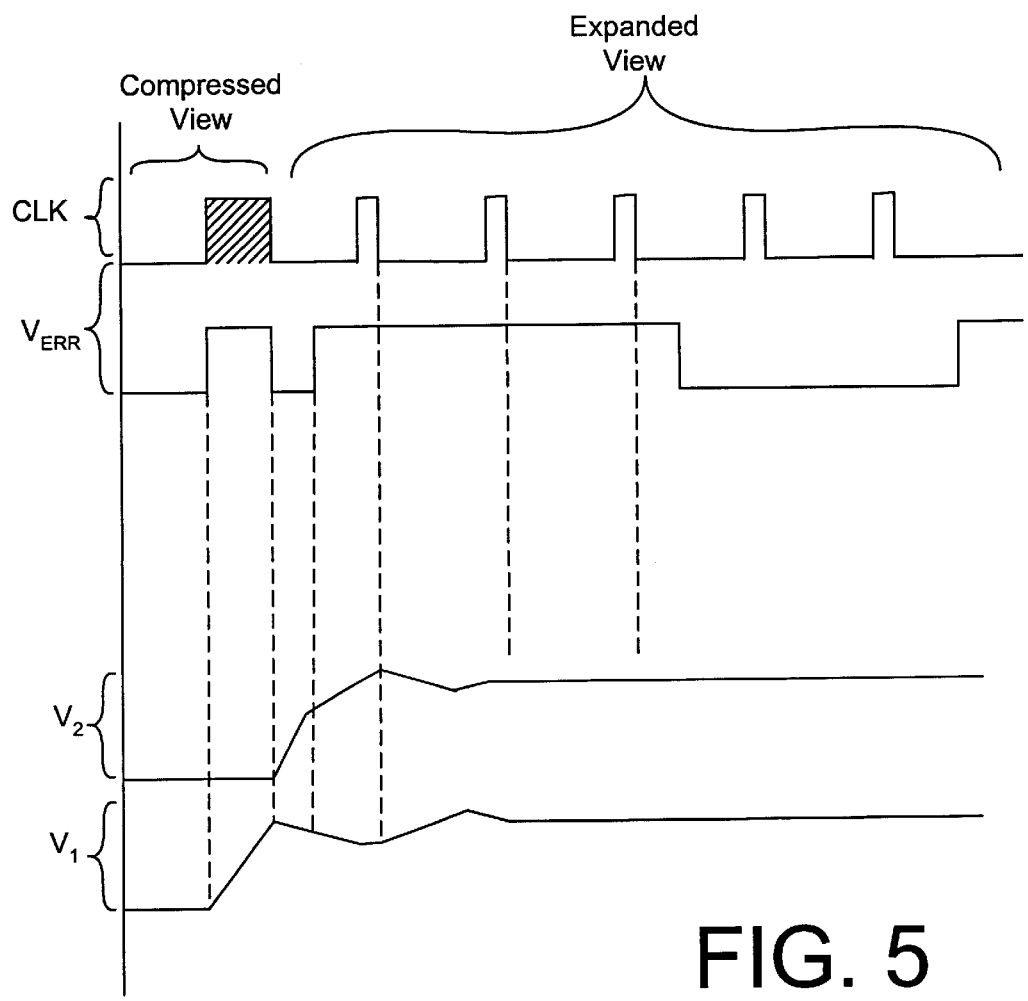
FIG. 5 illustrates a timing diagram associated with a presently preferred embodiment of the invention.

Referring to FIG. 5, timing waveforms associated with the start-up and steady-state operation of the presently preferred embodiment of the regulator circuit 10 are illustrated. At initial turn-on of the regulator circuit 10, the error signal transitions to a high state. The high state of the error signal permits the clock pulses to be applied to the first boost circuit 15b causing $V_1$ to increase. When $V_1$ reaches the nominal value, the error signal switches to a low state, disabling the clock pulses applied to the first boost circuit 15b, and enabling the clock pulses applied to the second boost circuit 15a. The second boost circuit output, $V_2$, increases during the time period that the error signal is in the low state. $V_2$ rises to a level that is greater than $V_1$. Current then leaks through the compensation circuit 21a to the first boost circuit 15b, offsetting the first boost circuit leakage current, causing $V_1$ to maintain a relatively constant value.

Although in the presently preferred embodiment the second boost circuit 15a is disabled during start-up of the regulator circuit 10, it is within the scope of the invention to enable both the first and second boost circuits 15b and 15a during start-up. In addition, the scope of the invention includes clock pulses to the boost circuits 15 that are either in-phase or out-of-phase.

Thus it will be appreciated from the above that as a result of the present invention, a circuit and method for regulating a voltage is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A regulator circuit for providing a regulated output voltage, comprising:
   a first boost circuit to generate a first pump voltage, the first boost circuit including a first charge pump to generate the first pump voltage from a first voltage source, the first charge pump including a first charge pump switch having a first leakage current;
   a second boost circuit to generate a second pump voltage, the second boost circuit including a second charge pump to generate the second pump voltage from a second voltage source;
   a compensation circuit coupled between the first boost circuit and the second boost circuit to supply a compensation current to the first boost circuit to compensate for energy losses caused by the first boost circuit leakage current;
   a sense circuit, responsive to the regulated output voltage, to generate the sense signal; and
   an amplifier having a reference input responsive to a reference voltage, a sense input in communication the sense signal, and an output, operable in response to a difference between the reference voltage and the sense signal, to control the first and second boost circuits.

2. The regulator circuit of claim 1 further including a voltage buffer responsive to an output of the first charge pump and an output of the second charge pump such that the regulated output voltage corresponding to the first and second pump voltages is generated.

3. The regulator circuit of claim 1 wherein the first boost circuit further includes a first driver coupled to the first charge pump for generating a first drive signal to drive the first charge pump, and wherein the second boost circuit further includes a second driver coupled to the second charge pump for generating a second drive signal to drive the second charge pump.

4. The regulator circuit of claim 1 further including a driver coupled to the first and second boost circuits to generate a drive signal to drive the first and second charge pumps.

5. The regulator circuit of claim 1 wherein the compensation circuit is a reverse-biased switch.

6. The regulator circuit of claim 5 wherein the reverse-biased switch is selected from the group of diodes and FETs.

7. The regulator circuit of claim 5 wherein the reverse-biased switch is selected to have reverse-biased operating characteristics that are similar to operating characteristics associated with the charge pump switch.

8. The regulator circuit of claim 1 wherein the compensation circuit couples energy from the second boost circuit pump voltage to the first boost circuit pump voltage.

9. The regulator circuit of claim 1 wherein the compensation circuit is responsive to the first boost circuit charge pump and the second boost circuit charge pump.

10. The regulator circuit of claim 1 wherein the regulator circuit is incorporated into a semiconductor device.

11. A method for providing a regulated output voltage, comprising:
   generating first and second drive signals;
   generating a first pump voltage in response to the first drive signal, the first pump voltage being boosted from a first voltage source, a leakage current being associated with the first pump voltage;
   generating a second pump voltage in response to the second drive signal, the second pump voltage being boosted from a second voltage source;
   supplying a compensation current between the second pump voltage and the first pump voltage to compensate for energy losses caused by the leakage current;
   generating a sense signal in accordance with the regulated output voltage;
   generating an error signal in response to determining a difference between a reference voltage and the sense signal representative of the first pump voltage; and
   controlling the drive signal in response to the error signal, whereby the first pump voltage is regulated.

12. The method of claim 11 including the step of voltage buffering the first pump voltage and the second pump voltage, whereby a buffered output voltage is generated.

13. The method of claim 11 wherein the step of supplying a compensation current includes providing a reverse-biased device coupled between the first pump voltage and the second pump voltage.

14. The method of claim 12 wherein the reverse-biased device is a diode configured device.

15. The method of claim 12 further comprising the step of filtering the first pump voltage.

16. The method of claim 12 wherein the step of generating the drive signal includes:
   generating a first drive signal corresponding the first pump voltage; and
   generating a second drive signal corresponding to the second pump voltage.

17. A regulator circuit for providing a regulated output voltage, comprising:
   means for generating first and second drive signals;
   means for generating a first pump voltage in response to the first drive signal, the first pump voltage being boosted from a first voltage source, a first leakage current being associated with the first pump voltage;
   means for generating a second pump voltage in response to the second drive signal, the second pump voltage being boosted from a second voltage source;
   means for supplying a compensation current between the second pump voltage and the first pump voltage to compensate for energy losses caused by the first leakage current;
   means for generating, responsive to the regulated output voltage, a sense signal
   means for generating an error signal in response to determining a difference between a reference voltage and a sense signal representative of the first pump voltage; and
   means for controlling the drive signal in response to the error signal, whereby the first pump voltage is regulated.

18. The circuit of claim 17 further including means for voltage buffering the first and second pump voltages such that an output voltage corresponding to the first pump voltage is generated.

19. The circuit of claim 17 wherein the means for generating a drive signal generates a corresponding drive signal for driving a corresponding boost circuit.

20. The circuit of claim 17 wherein the means for generating a drive signal generates a common drive signal for driving all of the boost circuits.

21. The circuit of claim 17 wherein the means for supplying a compensation current is a reverse-biased switch.

22. The circuit of claim 21 wherein the reverse-biased switch is a diode configured device.

23. The circuit of claim 21 wherein the reverse-biased switch is selected to have reverse-biased characteristics that are similar to temperature characteristics associated with the leakage current.

24. The circuit of claim 17 wherein the means for supplying a compensation current couples energy from the second boost circuit pump voltage to the first boost circuit pump voltage.

25. The circuit of claim 17 wherein the means for supplying a compensation current couples energy from the first boost circuit charge pump to the second boost circuit charge pump.

* * * * *